United States Patent [19]

Okada

[11] Patent Number: 5,437,196

[45] Date of Patent: Aug. 1, 1995

[54] DETECTOR FOR FORCE/ACCELERATION/MAGNETISM WITH RESPECT TO COMPONENTS IN MULTI-DIMENSIONAL DIRECTIONS

[76] Inventor: Kazuhiro Okada, 73, Sugaya 4-Chome, Ageo-Shi, Saitama 362, Japan

[21] Appl. No.: 9,288

[22] Filed: Jan. 26, 1993

[30] Foreign Application Priority Data

Feb. 4, 1992 [JP] Japan ................................. 4-048055

[51] Int. Cl.[6] .............................................. G01L 3/00
[52] U.S. Cl. ........................... 73/862.043; 73/862.626; 73/514.18
[58] Field of Search .................... 73/862.626, 862.041, 73/862.042, 862.043, 862.637, 862.638, 780, 517 R, 862.69

[56] References Cited

U.S. PATENT DOCUMENTS

| | | | |
|---|---|---|---|
| 4,016,164 | 4/1977 | Rice | 73/780 X |
| 4,552,028 | 11/1985 | Burckhardt et al. | 73/862.041 |
| 4,944,181 | 7/1990 | Wnuk | 73/780 |
| 5,055,838 | 10/1991 | Wise et al. | 73/862.626 X |
| 5,095,762 | 3/1992 | Holm-Kennedy et al. | 73/862.626 X |
| 5,174,159 | 12/1992 | Jacobsen et al. | 73/780 X |

FOREIGN PATENT DOCUMENTS 0133997 3/1985 European Pat. Off. .

*Primary Examiner*—Herbert Goldstein
*Assistant Examiner*—Elizabeth L. Dougherty
*Attorney, Agent, or Firm*—Ladas & Parry

[57] ABSTRACT

A force detector capable of detecting force components in respective axial directions and moment components about respective axes in an XYZ three-dimensional coordinate system is provided. A displacement body (10) is comprised of a disk shaped flat plate (11) and a pillar body (12) in the form of a square post. On the upper surface of the displacement body (10), five displacement electrodes (D1 to D5) are formed. Further, on the four side surfaces of the pillar body (12), eight displacement electrodes (D6 to D13) are formed. This displacement body (10) is held in a hanging state within the fixed body (20). Within the fixed body (20), fixed electrodes (E1 to E13) are provided at positions opposite to the respective displacement electrodes (D1 to D13). Thus, capacitance elements (C1 to C13) are constituted by the respective opposite electrode pairs. On the basis of changes in capacitance values of respective capacitance elements, force components Fx, Fy, Fz in respective axial directions and moment components Mx, My, Mz about respective axes are determined.

7 Claims, 16 Drawing Sheets

FIG. 9

|    | C1 | C2 | C3 | C4 | C5 | C6 | C7 | C8 | C9 | C10 | C11 | C12 | C13 |
|----|----|----|----|----|----|----|----|----|----|-----|-----|-----|-----|
| Fx | 0  | 0  | 0  | 0  | 0  | +  | +  | 0  | 0  | −   | −   | 0   | 0   |
| Fy | 0  | 0  | 0  | 0  | 0  | 0  | 0  | +  | +  | 0   | 0   | −   | −   |
| Fz | +  | +  | +  | +  | +  | 0  | 0  | 0  | 0  | 0   | 0   | 0   | 0   |
| Mx | 0  | +  | 0  | −  | 0  | 0  | 0  | 0  | 0  | 0   | 0   | 0   | 0   |
| My | −  | 0  | +  | 0  | 0  | 0  | 0  | 0  | 0  | 0   | 0   | 0   | 0   |
| Mz | 0  | 0  | 0  | 0  | 0  | +  | −  | +  | −  | +   | −   | +   | −   |

FIG. 17

| | C1 | C2 | C3 | C4 | C5 | C6 | C7 | C8 | C9 | C10 | C11 | C12 | C13 | C14 | C15 |
|---|---|---|---|---|---|---|---|---|---|---|---|---|---|---|---|
| Fx | 0 | 0 | 0 | + | + | + | 0 | 0 | 0 | − | − | − | 0 | 0 | 0 |
| Fy | 0 | 0 | 0 | 0 | 0 | 0 | + | + | + | 0 | 0 | 0 | − | − | − |
| Fz | + | + | + | 0 | 0 | 0 | 0 | 0 | 0 | 0 | 0 | 0 | 0 | 0 | 0 |
| Mx | − | + | 0 | 0 | 0 | 0 | 0 | 0 | 0 | 0 | 0 | 0 | 0 | 0 | 0 |
| My | 0 | 0 | 0 | + | 0 | − | 0 | 0 | 0 | − | 0 | + | 0 | 0 | 0 |
| Mz | 0 | 0 | 0 | 0 | 0 | 0 | + | 0 | − | 0 | 0 | 0 | − | 0 | + |

FIG. 22

|    | C1 | C2 | C3 | C4 | C5 | C6 | C7 | C8 | C9 | C10 | C11 | C12 | C13 |
|----|----|----|----|----|----|----|----|----|----|-----|-----|-----|-----|
| Fx | o  | +  | +  | +  | +  | +  | +  | o  | o  | o   | o   | o   | o   |
| Fy | o  | o  | o  | o  | o  | o  | o  | +  | +  | +   | +   | +   | +   |
| Fz | +  | o  | o  | o  | o  | o  | o  | o  | o  | o   | o   | o   | o   |
| Mx | o  | o  | o  | o  | o  | o  | o  | −  | o  | +   | −   | o   | +   |
| My | o  | +  | o  | −  | +  | o  | −  | o  | o  | o   | o   | o   | o   |
| Mz | o  | +  | +  | +  | −  | −  | −  | +  | +  | +   | −   | −   | −   |

|    | C14 | C15 | C16 | C17 | C18 | C19 | C20 | C21 | C22 | C23 | C24 | C25 |
|----|-----|-----|-----|-----|-----|-----|-----|-----|-----|-----|-----|-----|
| Fx | −   | −   | −   | −   | −   | −   | o   | o   | o   | o   | o   | o   |
| Fy | o   | o   | o   | o   | o   | o   | −   | −   | −   | −   | −   | −   |
| Fz | o   | o   | o   | o   | o   | o   | o   | o   | o   | o   | o   | o   |
| Mx | o   | o   | o   | o   | o   | o   | +   | o   | −   | +   | o   | −   |
| My | −   | o   | +   | −   | o   | +   | o   | o   | o   | o   | o   | o   |
| Mz | +   | +   | +   | −   | −   | −   | +   | +   | +   | −   | −   | −   |

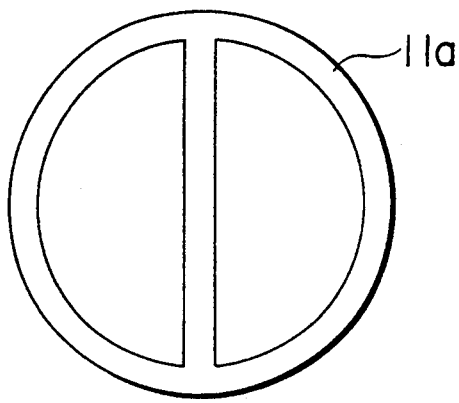
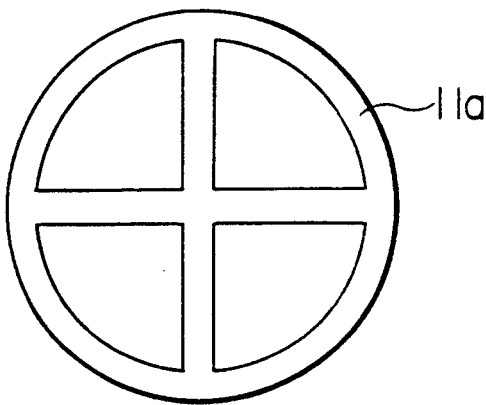
FIG. 23A  FIG. 23B
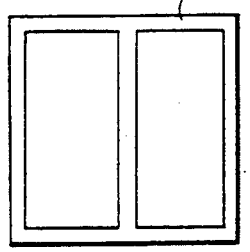
FIG. 24A
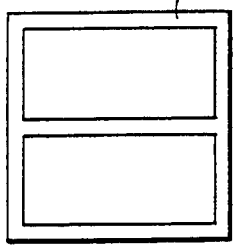
FIG. 24B
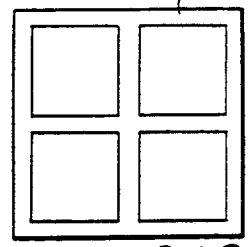
FIG. 24C
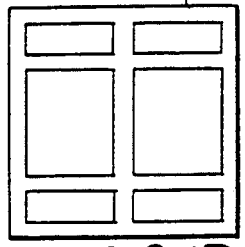
FIG. 24D
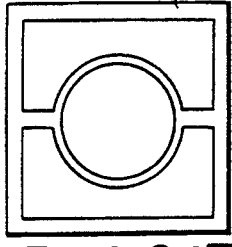
FIG. 24E
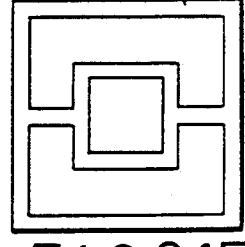
FIG. 24F

DETECTOR FOR FORCE/ACCELERATION/MAGNETISM WITH RESPECT TO COMPONENTS IN MULTI-DIMENSIONAL DIRECTIONS

BACKGROUND OF THE INVENTION

This invention relates to a detector for force, acceleration or magnetism, and more particularly to a detector capable of obtaining detection values every respective components in multi-dimensional directions.

In the automobile industry, or machinery industory, there has been an increased demand for detectors capable of precisely detecting a physical quantity such as force, acceleration or magnetism. Particularly, miniaturized detectors capable of detecting such physical quantities every respective components in two-dimensional or three-dimensional directions are desired.

In order to cope with such demand, there has been proposed a detector for force/acceleration/magnetism in which gauge resistors are formed on a semiconductor substrate such as silicon, etc. to transform a mechanical distortion produced in the substrate on the basis of a force applied from the external to an electric signal by making use of the piezo resistance effect. However, such detector using gauge resistor has the problem that the manufacturing cost is high and any temperature compensation is required.

In view of this, in recent years, there has been proposed a detector in which capacitance elements or piezoelectric elements are used to carry out detection of a physical quantity. For example, in the U.S. patent application Ser. No. 07/761,771 (European Patent Application No. 91900948.0), a novel detector utilizing changes in the electrostatic capacity has been proposed. In this novel detector, a capacitance element is constituted by a fixed electrode formed on a fixed substrate and a displacement electrode producing a displacement by action of a force. Respective components in multi-dimensional directions of an applied force can be detected on the basis of changes in the electrostatic capacity of the capacitance element. Further, in the U.S. patent application Ser. No. 07/764,159 (European Patent Application No. 91117418.0), a method of manufacturing such a novel detector is disclosed. In the No. PCT/JP91/00428 according to the International Application based on the Patent Cooperation Treaty, a method of testing or inspecting such a novel detector is disclosed. In addition, in the No. PCT/JP92/00882, a detector using piezoelectric element in place of capacitance element is disclosed.

The above described detectors are such that a plurality of capacitance elements or piezoelectric elements are arranged in a two-dimensional manner, thus aiming at respectively detecting a moment Mx about the X-axis, a moment My about the Y-axis and a force Fz in the Z-axis direction in the XYZ three-dimensional coordinate system. For this reason, these detectors cannot carry out additional detections of a force Fx in the X-axis direction, a force Fy in the Y-axis direction, and a moment Mz about the Z-axis which are components except for the above. However, in the industrial machineries, etc., there are instances where detections of all of force components in respective axial directions and moment components about respective axes are required.

SUMMARY OF THE INVENTION

With the above in view, an object of this invention is to provide a detector for force/acceleration/magnetism with respect to components in multi-dimensional directions, which can detect moment components about respective axes along with force components in respective axial directions.

The first feature of this invention resides in a detector for detecting components in multi-dimensional directions of a force in an XYZ three-dimensional coordinate system, the detector comprising:

a fixed body having a flexible portion deformed when a force is applied thereto;

a displacement body supported by the flexible portion;

first detection means for detecting a distance between a first displacement surface defined at a portion of the displacement body and a first fixed surface opposite to the first displacement surface and defined at a portion of the fixed body;

second detection means for detecting a distance between a second displacement surface intersecting with the first displacement surface and defined at a portion of the displacement body and a second fixed surface opposite to the second displacement surface and defined at a portion of the fixed body; and operational or arithmetic means for arithmetically determining a force exerted on the displacement body every force components in the coordinate axis directions and moment components about the coordinate axes on the basis of a detection value obtained by the first detection means and a detection value obtained by the second detection means.

The second feature of this invention resides in that, in the above described detector according to the first feature, the first and second displacement surfaces are formed so that they are perpendicular to each other, and the first and second fixed surfaces are formed so that they are perpendicular to each other.

The third feature of this invention resides in that, in the above described detector according to the second feature, an origin of the XYZ three-dimensional coordinate system is defined at a predetermined position within the displacement body, a first displacement surface is defined on a plane in parallel to an XY-plane, and a second displacement surface is defined on a plane in parallel to a Z-axis, to determine a moment component Mx about an X-axis, a moment component My about a Y-axis, and a force component Fz in a Z-axis direction on the basis of a detection value obtained by the first detection means, and to determine a force component Fx in an X-axis direction, a force component Fy in a Y-axis direction, and a moment component Mz about a Z-axis on the basis of a detection value obtained by the second detection means.

The fourth feature of this invention resides in that, in the above described detector according to the second feature, an origin of the XYZ three-dimensional coordinate system is defined at a predetermined position within the displacement body, a first displacement surface is defined on a plane in parallel to an XY-plane, and a second displacement surface is defined on a plane in parallel to the Z-axis, to determine a moment component Mx about an X-axis and a force component Fz in a Z-axis direction on the basis of a detection value obtained by the first detection means, and to determine a force component Fx in an X-axis direction, a force component Fy in a Y-axis direction, a moment component My about a Y-axis, and a moment component Mz about the Z-axis on the basis of a detection value obtained by the second detection means.

The fifth feature of this invention resides in that, in the above described detector according to the second feature, an origin of the XYZ three-dimensional coordinate system is defined at a predetermined position within the displacement body, a first displacement surface is defined on a plane in parallel to an XY-plane, and a second displacement surface is defined on a plane in parallel to the Z-axis, to determine a force component Fz in a Z-axis direction on the basis of a detection value obtained by the first detection means, and to determine a force component in an X-axis direction, a moment component Mx about an X-axis, a force component Fy in a Y-axis direction, a moment component My about the Y-axis, and a moment component Mz about the Z-axis on the basis of a detection value obtained by the second detection means.

The sixth feature of this invention resides in that, in the above described detector according to the first feature, a first capacitance element constituted by a first displacement electrode formed on the first displacement surface and a first fixed electrode formed on the first fixed surface is provided at the first detection means to carry out detection of a distance on the basis of a capacitance value of the first capacitance element, and a second capacitance element constituted by a second displacement electrode formed on the second displacement surface and a second fixed electrode formed on the second fixed surface is provided at the second detection means to carry out detection of a distance on the basis of a capacitance value of the second capacitance element.

The seventh feature of this invention resides in that, in the above described detector according to the first feature, a force produced due to acceleration is caused to be exerted on the displacement body, thus permitting detection of an acceleration.

The eighth feature of this invention resides in that, in the above described detector according to the first feature, a force produced due to magnetism is caused to be exerted on the displacement body, thus permitting detection of magnetism.

In this invention, the displacement body is supported by the flexible portion formed at a portion of the fixed body. Accordingly, when a force from the external is applied to the displacement body, the flexible portion of the displacement body produces bending, so the position of the displacement body relative to the fixed body varies. This change of position yields a change in the distance between the displacement surface defined on the displacement body and the fixed surface defined on the fixed body. Since this change of distance includes information of the magnitude and the direction of the applied force, a predetermined operation is performed on the basis of a detection value of this distance, thereby making it possible to determine the magnitude and the direction of the applied force.

The feature of the detector according to this invention resides in that two displacement surfaces of the first and second displacement surfaces are defined on the displacement body, and that two fixed surfaces of the first and second fixed surfaces are defined on the fixed body as surfaces opposite to the two displacement surfaces. A distance between the first displacement surface and the first fixed surface is detected by the first detection means, and a distance between the second displacement surface and the second fixed surface is detected by the second detection means. Here, since the first and second displacement surfaces are surfaces crossing or intersecting each other (more preferably perpendicular to each other), a detection value by the first detection means and a detection value by the second detection means will include respective independent information. Accordingly, by utilizing detection values by the both detection means, it is possible to detect at the same time force components Fx, Fy and Fz in respective axial directions and moment components Mx, My and Mz about respective axes in the XYZ three-dimensional coordinate system.

BRIEF DESCRIPTION OF THE DRAWINGS

FIG. 9 is a table for explaining the operation of the force detector shown in FIG. 5.

FIG. 17 is a table for explaining the operation of the force detector shown in FIG. 11.

FIG. 22 is a table for explaining the operation of the force detector shown in FIG. 18.

FIGS. 23A and 23B shown a view showing various electrode arrangements on a first displacement surface in the force detector according to this invention.

FIGS. 24A to 24F show various electrode arrangements on a second displacement surface in the force detector according to this invention.

DESCRIPTION OF THE PREFERRED EMBODIMENTS

§1 Basic Principle of this Invention

Figure 1:
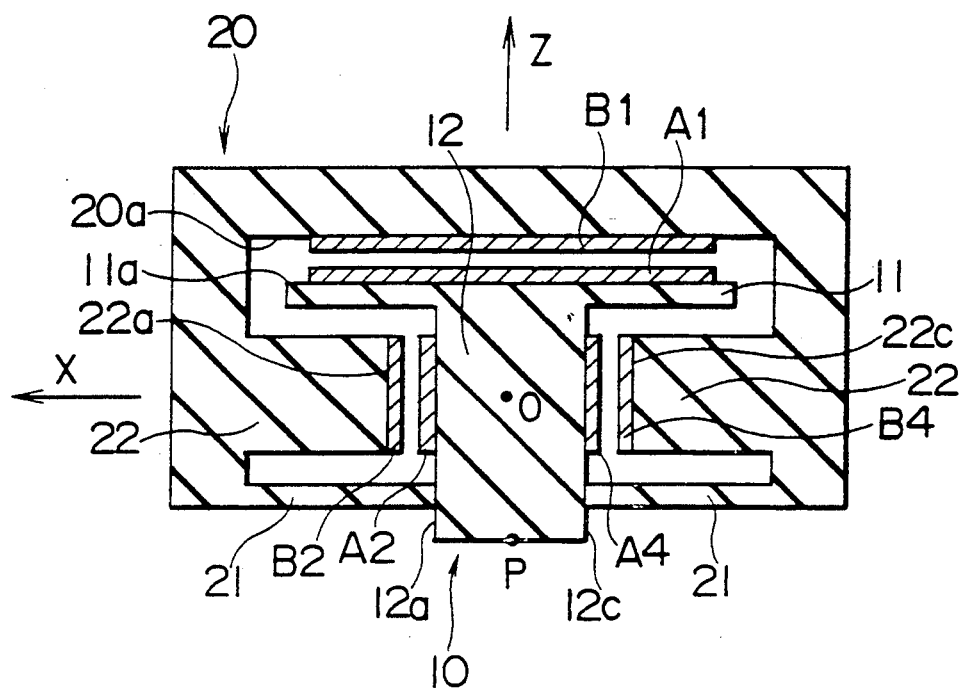
FIG. 1 is a side cross sectional view of a force detector according to a basic embodiment of this invention.

This invention will now be described in accordance with the embodiments shown. The basic principle of this invention will be described first in accordance with the basic embodiment shown in FIG. 1. A force detector according to this embodiment includes a displacement body 10 and a fixed body 20. The displacement body 10 is of a structure, as its perspective view is shown in FIG. 2, comprising a disk shaped flat plate 11 and a pillar body 12 in the form of a square post member. The pillar body 12 is connected to the lower surface of the flat plate 11. It is to be noted that while, for convenience of explanation of the structure in this specification, the displacement body 10 is divided into two components of the flat plate 11 and the pillar body 12, the displacement body 10 may be prepared by integral molding in a practical sense. An electrode A1 is formed on the upper surface 11a of the flat plate 11. Further, electrodes A2, A3, A4 and A5 are formed on side surfaces 12a, 12b, 12c and 12d of the pillar body 12, respectively. It is to be noted that although only portions of respective side surfaces are indicated in FIG. 2, the side surface 12c is the surface positioned on the opposite side of the side surface 12a, and the side surface 12d is the surface positioned on the opposite side of the side surface 12b. In addition, the electrode A4 is formed on the side surface 12c (not shown), and the electrode A5 is formed on the side surface 12d (not shown). Hereinafter, these respective electrodes will be called displacement electrodes A1 to A5, and surfaces on which these displacement electrodes are formed will be called a displacement surfaces.

Figure 2:
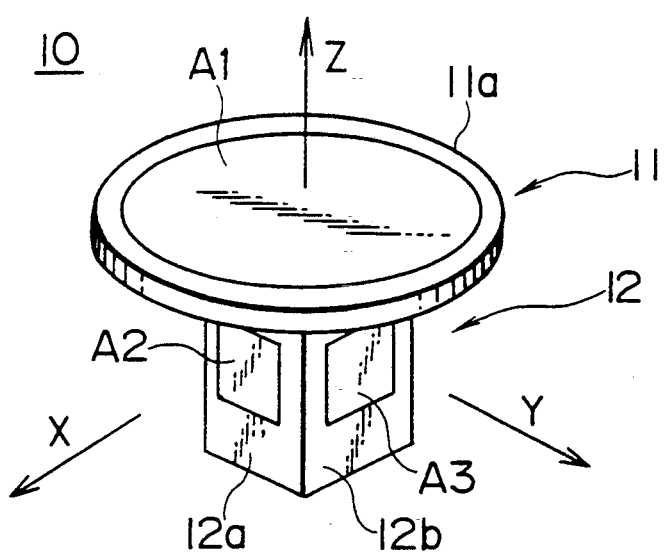
FIG. 2 is a perspective view of a displacement body 10 in the force detector shown in FIG. 1.

Let now suppose, as shown in FIG. 1, that an origin O is defined at a point (e.g., position of center of gravity) within the displacement body 10, and an X-axis, a Z-axis and a Y-axis are respectively defined in a left direction of FIG. 1, in an upper direction thereof, and in a direction perpendicular to the plane surface of paper and extending this side thus to assume an XYZ three-dimensional coordinate system. Thus, the X-axis, the Y-axis and the Z-axis are defined as shown in FIG. 2 with respect to the displacement body 10. The cross section in respect of the XZ-plane of the displacement body 10 is shown in FIG. 1.

On the other hand, the fixed body 20 takes a form to surround the periphery of the displacement body 10 as shown in FIG. 1. The fixed body 20 is in the form of a rectangular parallelopiped in appearance, and includes a flexible portion 21 formed on the bottom portion thereof. This flexible portion 21 is formed so as to produce a displacement when a force is applied thereto, and the displacement body 10 is in the state where it is supported by the flexible portion 21. Namely, the flexible portion 21 is comprised of a member in the form of a flat plate. In this embodiment, a square window is opened at the central portion of the flexible portion 21, and the pillar body 12 is fixed in the state where it is penetrated through the window. In actual terms, if the pillar body 12 is fixed at the central portion of the flexible portion 21 by a method such as using screws, etc., a more reliable fixing can be made. As shown in FIG. 1, the displacement body 10 is supported only by this flexible portion 21, and is in the state where it is not in contact with the fixed body 20 except for that supporting portion. While the pillar body 12 is surrounded by a surrounding portion 22 from all quarters, a predetermined gap or spacing is formed therebetween. Eventually, the displacement body 10 is in a hanging state in a space formed or defined within the fixed body 20. As previously described, the flexible portion 21 produces a displacement when a force is applied thereto. Accordingly, when a force is applied to the working point P defined on the bottom surface of the pillar body 12, a bending is produced in the flexible portion 21. Thus, the displacement body 10 undergoes displacement. The displacement state at this time is determined on the basis of the applied force. The basic principle of this invention resides in that such displacement state is detected to thereby detect an applied force.

Figure 3:
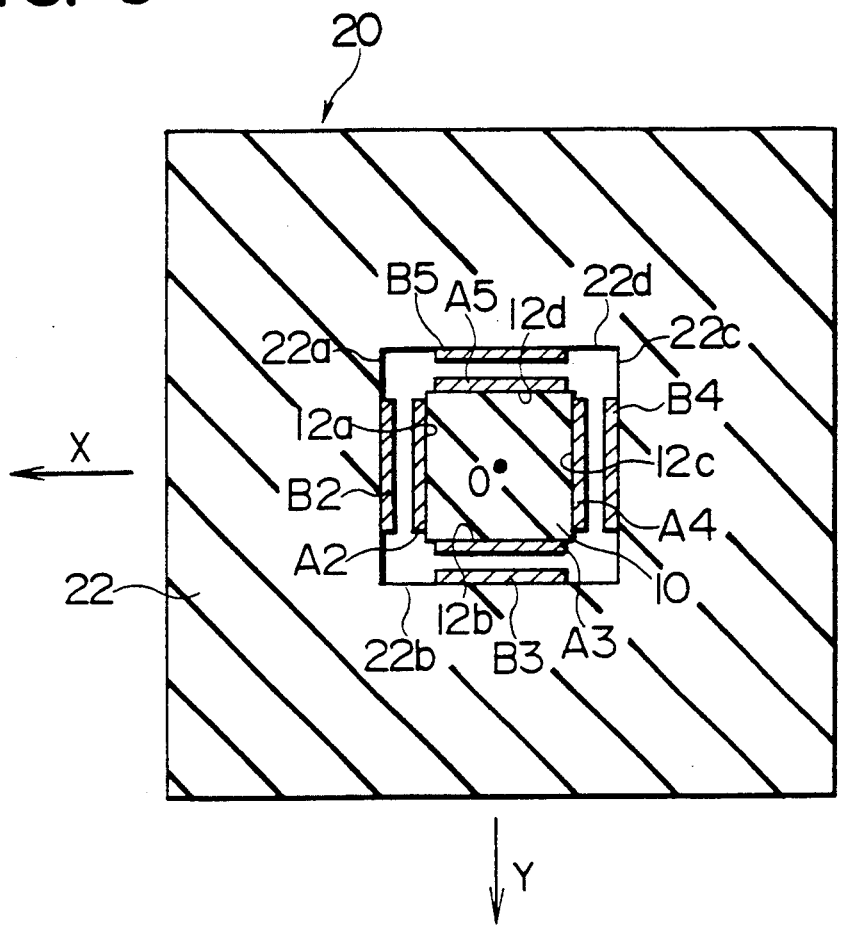
FIG. 3 is a lateral cross sectional view cut along the XY-plane of the force detector shown in FIG. 1.

On the inner wall of the fixed body 20, fixed surfaces opposite to respective displacement surfaces of the displacement body 10 are formed. Namely, the fixed surface 20a is the surface opposite to the displacement surface 11a, and fixed surfaces 22a, 22b, 22c and 22d are respectively surfaces opposite to the displacement surfaces 12a, 12b, 12c and 12d. Further, fixed electrodes respectively opposite to the displacement electrodes are formed on the respective fixed surfaces. Namely, a fixed electrode B1 is formed on the fixed surface 20a, and fixed electrodes B2, B3, B4 and B5 are respectively formed on the fixed surfaces 22a, 22b, 22c and 22d. FIG. 3 is a cross sectional view cut along the XY-plane of the detector shown in FIG. 1, in which the positional relationship between respective opposite surfaces and respective electrodes is clearly indicated. It is to be noted that, for the purpose of facilitating illustration, in the drawings of this application, depicting is made in such a manner that the thicknesses of respective electrodes are disregarded in the perspective view (e.g., FIG. 2), and depicting is made in such a manner that the thicknesses of respective electrodes are exaggerated in the cross sectional view (e.g., FIG. 1 or FIG. 3).

Here, a capacitance element C1 is formed by opposite electrodes A1 and B1, a capacitance element C2 is formed by opposite electrodes A2 and B2, a capacitance element C3 is formed by opposite electrodes A3 and B3, a capacitance element C4 is formed by opposite electrodes A4 and B4, and a capacitance element C5 is formed by opposite electrodes A5 and B5. Generally, when the electrode area, the electrode interval or spacing, and the dielectric constant are respectively represented by S, d and $\epsilon$, the electrostatic capacitance C of the capacitance element C is determined by the following relationship:

$$C = \epsilon S/d$$

Accordingly, when the interval between opposite electrodes becomes small, the electrostatic capacitance C becomes large. In contrast, when that interval becomes large, the electrostatic capacitance C becomes small. For this reason, it is possible to determine distances between respective opposite electrodes (i.e., distances between respective opposite surfaces) on the basis of changes in capacitance values of respective capacitance elements. The detector of this invention utilizes the above principle to measure changes in electrostatic capacitance values between respective electrodes, thus to detect an external force exerted on the working point P on the basis of these measured values.

Figure 4:
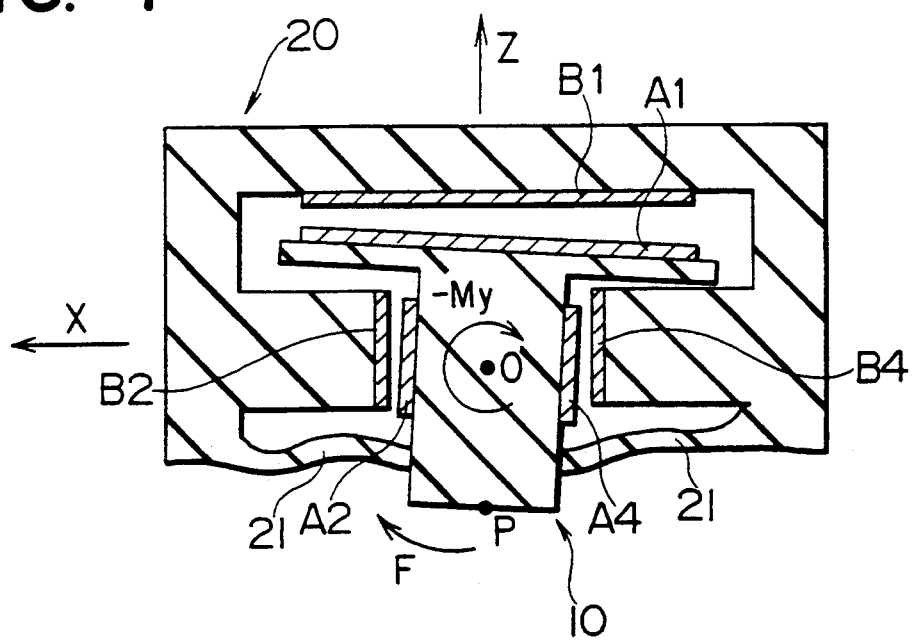
FIG. 4 is a side cross sectional view showing the state where a moment $-My$ about the Y-axis is exerted on the force detector shown in FIG. 1.

For example, in FIG. 1, when a force +Fx in the X-axis direction is applied to the working point P, the portion on the left side of the figure of the flexible portion 21 contracts, and the portion on the right side thereof expands. As a result, the entirety of the displacement body 10 undergoes parallel displacement in a left direction of the figure. Namely, the origin O moves in a positive direction on the X-axis. For this reason, the electrode interval of the capacitance element- C2 constituted by paired electrodes A2 and B2 becomes small, so the capacitance value increases. In contrast, the electrode interval of the capacitance element C4 constituted by paired electrodes A4 and B4 becomes large, so the capacitance value decreases. At this time, the spacings between paired electrodes A1 and B1, paired electrodes A3 and B3, and paired electrodes A5 and B5 are not changed. Further, as shown in FIG. 4, in the case where an external force as indicated by the arrow F of the figure is exerted on the working point P, this external force exerts a moment −My (the sign of the moment will be described later) about the Y-axis on the origin O. Namely, a bending is produced in the flexible portion 21, so the displacement body 10 is inclined as shown within the fixed body 20. It is to be noted that while when an external force as indicated by the arrow F of the figure is applied, not only the moment −My but also the force +Fx are actually applied, consideration is made here only in connection with the moment −My about the Y-axis for the brevity of explanation. In this case, distances or intervals between respective electrodes become small or large in part. While a technique for independently detecting moment components about respective axes will be described in detail later, the feature of this invention resides in that even if an applied force is force components in respective axial directions or moment components about respective axes, it is possible to detect such components of the applied force. It is to be noted that the term "force" is generically used in connection with force components in respective axial directions and moment components about respective axes in this specification.

In short, the basic principle of this invention is to obtain information relating to the direction of an applied force by examining a pattern of how capacitance values of respective capacitance elements vary and to obtain information relating to the magnitude of the applied external force by examining what quantity of a change of the capacitance value is. In addition, in this invention, displacements are determined with respect to two kinds of displacement surfaces. Assuming now that a displacement surface 11a on which the electrode A1 is formed is called a first displacement surface, and displacement surfaces on which electrodes A2, A3, A4 and A5 are respectively formed are called a second displacement surface, the first and second displacement surfaces exhibit peculiar displacement modes in dependency upon the applied force, respectively. The detector of this invention can detect both force components in respective axial directions and moment components about respective axes on the basis of these two kinds of displacement modes. This invention will now be described in detail in accordance with embodiments presented in a more practical sense.

§2 First Embodiment

Figure 5:
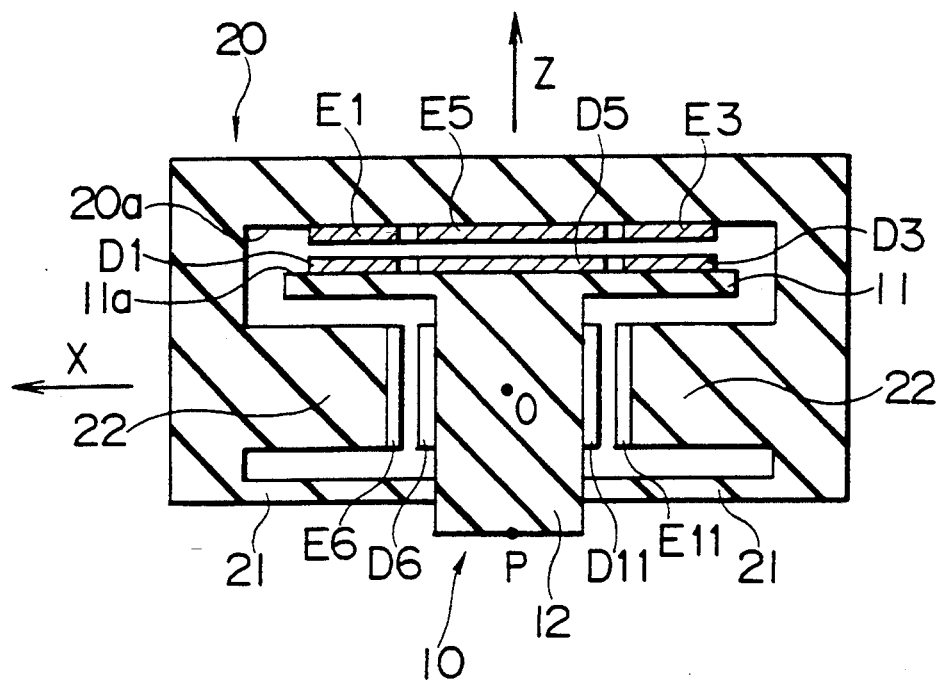
FIG. 5 is a side cross sectional view of a force detector according to a first embodiment presented in a more practical sense of this invention.
Figure 6:
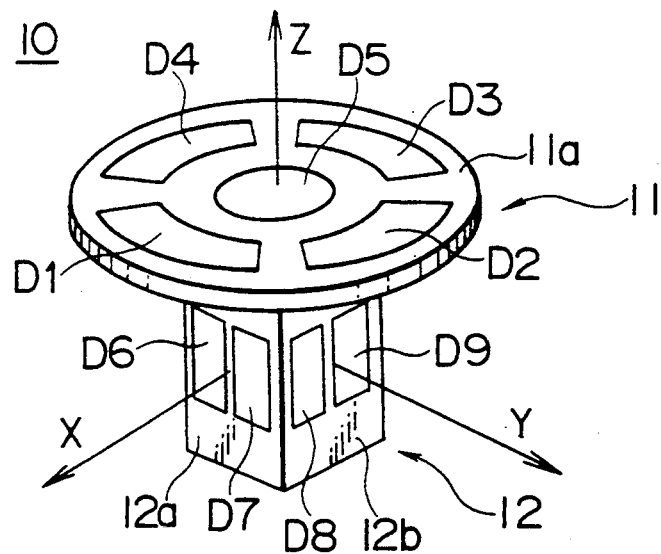
FIG. 6 is a perspective view of a displacement body 10 in the force detector shown in FIG. 5.
Figure 7:
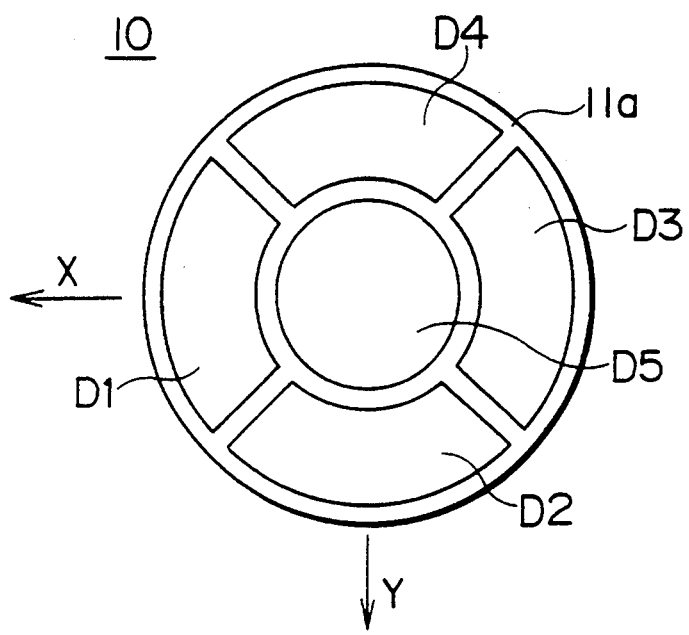
FIG. 7 is a top view of the displacement body 10 in the force detector shown in FIG. 5.
Figure 8:
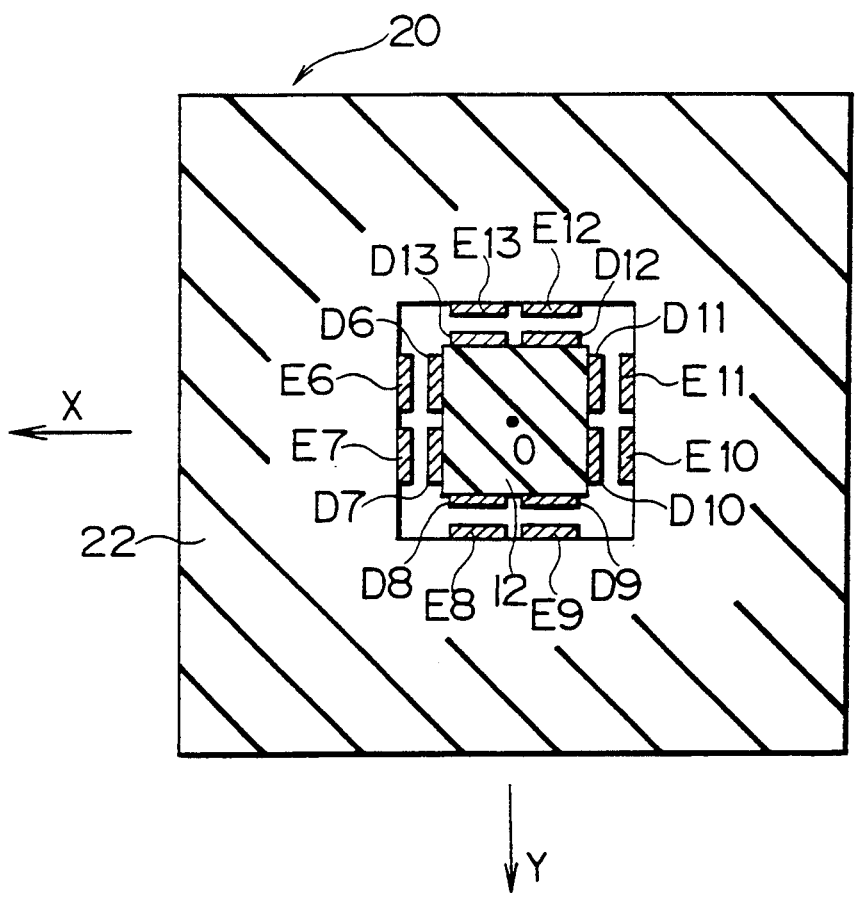
FIG. 8 is a lateral cross sectional view cut along the XY-plane of the force detector shown in FIG. 5.

A first embodiment presented in a more practical sense of this invention will now be described. FIG. 5 is a side cross sectional view of a force detector according to the first embodiment. This detector comprises displacement body 10 and fixed body 20 similarly to the previously described basic embodiment, and these structures are as previously described. This embodiment differs from the basic embodiment in the number of electrodes and the arrangement thereof. FIG. 6 is a perspective view of the displacement body 10 in this embodiment, and the cross section cut along the XZ-plane of the displacement body 10 is shown in FIG. 5. In this embodiment, thirteen displacement electrodes D1 to D13 in total (the electrodes D10 to D13 thereof are not indicated in FIG. 6) are arranged. Namely, the displacement electrodes D1 to D4 are symmetrically arranged in a manner to surround the displacement electrode D5 positioned in the center on the first displacement surface (the upper surface 11a of the flat plate 11), and the state thereof is clearly indicated in FIG. 7 showing the upper surface of the displacement body 10. Further, eight displacement electrodes D6 to D13 are symmetrically arranged on the second displacement surfaces (four side surfaces of the pillar body 12), and the state thereof is clearly indicated in FIG. 8 showing the cross section cut along the XY-plane of this detector. In addition, fixed electrodes E1 to E13 are arranged on the inner surface of the fixed body 20 so as to oppose the respective displacement electrodes D1 to D13. In such arrangement, a capacitance element C1 is formed by paired electrodes D1 and E1. In a manner similar to the above, capacitance elements C2, C3, . . . C13 are formed by paired electrodes D2, E2, paired electrodes D3, E3, . . . paired electrodes D13, E13, respectively.

Let now consider how capacitance values of respective capacitance elements C1 to C13 vary in the case where force components in respective axial directions are applied to the working point P defined on the bottom surface of the displacement body 10. When a force Fx in the X-axis direction is first applied, the entirety of the pillar body 12 undergoes parallel displacement in a left direction in FIG. 8. For this reason, the electrode intervals or spacings between paired electrodes D6, E6 and between paired electrodes D7, E7 become small, and the intervals or spacings between paired electrodes D10, E10 and paired electrodes D11, E11 become large. For this reason, the capacitance values of the capacitance elements C6, C7 increase, and the capacitance values of the capacitance elements C10, C11 decrease. Since there is no change in other intervals or spacings between other paired electrodes, there occurs no change in the capacitance values of other capacitance elements. On the first row (row indicated by Fx) of the table shown in FIG. 9, changes of the capacitance values of respective capacitance elements C1 to C13 when a force Fx in the X-axis direction is applied are shown. In this table, "0", "+" and "—" indicate no change, an increase in the capacitance value, and a decrease in the capacitance value, respectively. Similarly, when a force Fy in the Y-axis direction is applied, a result as on the second row (row indicated by Fy) of the table shown in FIG. 9 is obtained. In addition, when a force Fz in the Z-axis direction is applied, the entirety of the displacement body 10 undergoes parallel displacement in an upper direction in FIG. 5. For this reason, electrode intervals or spacings between paired electrodes D1, E1 to paired electrodes D5, E5 become small, so the capacitance values of the capacitance elements C1 to C5 increase. Since there is no change in the intervals or spacings between other paired electrodes, there occurs no change in the capacitance values of other capacitance elements. Accordingly, a result as shown on the third row (row indicated by Fz) of the table shown in FIG. 9 is obtained. It is to be noted that in the case where force components —Fx, —Fy and —Fz in a negative direction with respect to respective axes are applied, the relationship between "+" and "—" in the table is reversed. In addition, when an applied force becomes large, a quantity of a change of the capacitance value becomes large accordingly.

Let now consider how capacitance values of respective capacitance elements C1 to C13 vary in the case where moment components about respective axes are applied to the working point P defined on the bottom surface of the displacement body 10. First, when a moment My about the Y-axis is applied, the entirety of the displacement body 10 undergoes rotational displacement in a counterclockwise direction with the origin O being as a center (here, the direction of rotation which should be rendered to a right screw in order to advance that screw in a positive direction of the moment about the Y-axis is defined as a positive direction of the moment about the Y-axis). Accordingly, the electrode interval or spacing between paired electrodes D1 and E1 becomes large, and the electrode interval or spacing between paired electrodes D3 and E3 becomes small. For this reason, the capacitance value of the capacitance element C1 decreases, and the capacitance value of the capacitance element C3 increases. Although intervals or spacings between other paired electrodes become small or large in part, changes in the electrode intervals or spacings are canceled in the entirety of respective sets of electrodes. For this reason, there occurs no change in the capacitance values of other capacitance elements. Accordingly, a result as shown on the fifth row (row indicated by My) of the table shown in FIG. 9 is obtained. Similarly, when a moment Mx about the X-axis is applied, a result as shown on the fourth row (row indicated by Mx) of the table shown in FIG. 9 is obtained. In addition, when a moment Mz about the Z-axis is applied, the entirety of the pillar body 12 undergoes a rotational displacement in a counterclockwise direction with the origin O being as a center in FIG. 8.

For this reason, the electrode intervals or spacings between paired electrodes D6, E6, the paired electrodes D8, E8, the paired electrodes D10, E10, and the paired electrodes D12, E12 become small, so the capacitance values of the capacitance elements C6, C8, C10 and C12 increase. In contrast, the electrode intervals or spacings between paired electrodes D7, E7, paired electrodes D9, E9, paired electrodes D11, E11, and paired electrodes D13, E13 become large, so the capacitance values of the capacitance elements C7, C9, C11 and C13 decrease. Since the intervals or spacings between other electrode pairs do not change, there occurs no change in the capacitance values of other capacitance elements. Accordingly, a result as shown on the sixth row (row indicated by Mz) of the table shown in FIG. 9 is obtained. It is to be noted that in the case where moment components —Mx, —My and —Mz in a counterclockwise direction with respect to respective axes are applied, the relationship between "+" and "—" in the table is reversed. In addition, when an applied moment becomes large, a quantity of a change of the capacitance value becomes large accordingly.

Figure 10:
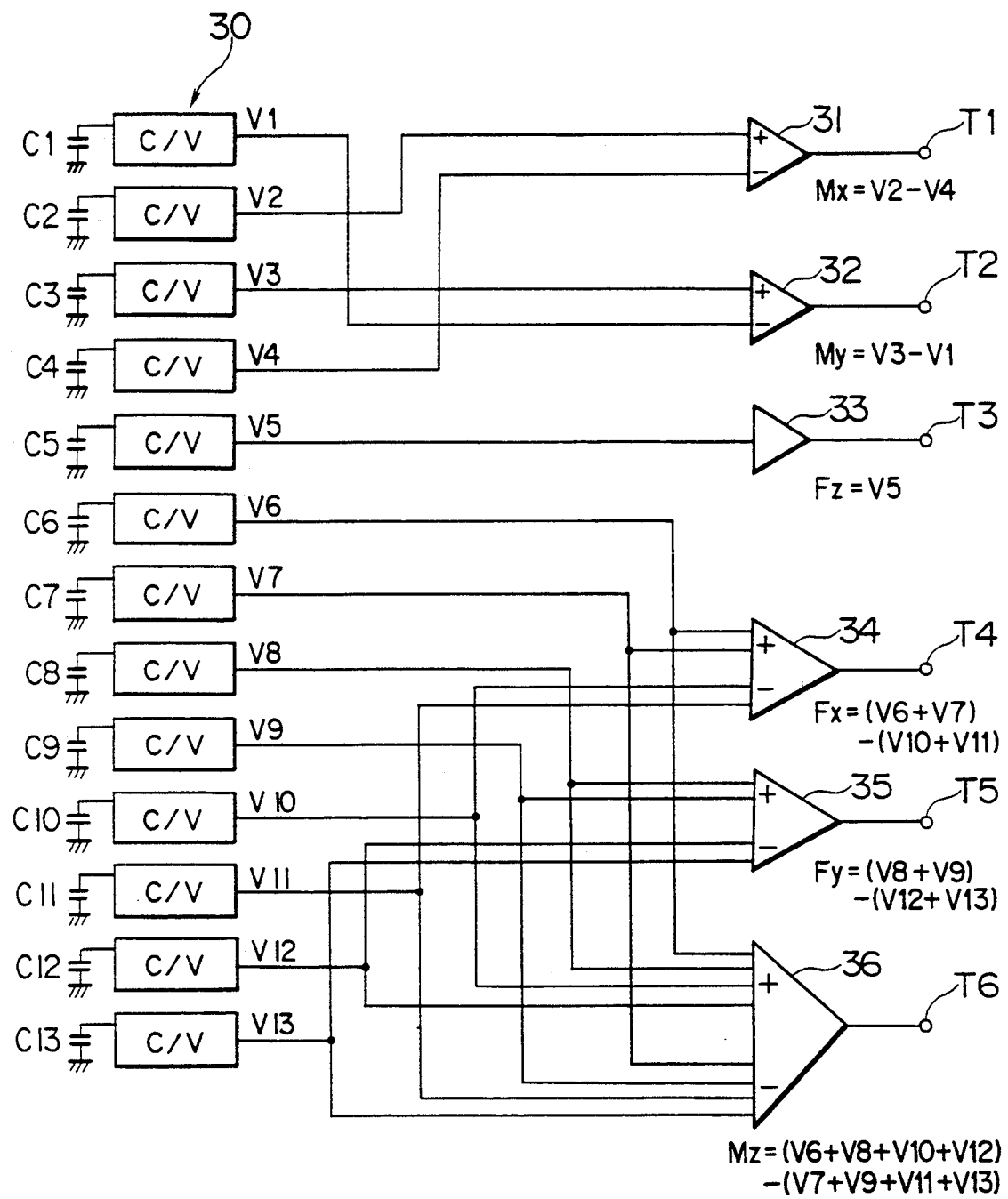
FIG. 10 is a circuit diagram showing an example of an operation circuit used in the force detector shown in FIG. 5.

It is seen from the table of FIG. 9 that unique results were obtained in connection with force components Fx, Fy, Fz in respective axial directions and moment components Mx, My, Mz about respective axes. In view of this, if capacitance values with respect to respective capacitance elements C1 to C13 are detected, it is possible to arithmetically determine force components Fx, Fy, Fz in respective axial directions and moment components Mx, My, Mz about respective axes on the basis of these capacitance values. FIG. 10 is a circuit diagram showing an example of a circuit for performing such operation. In this circuit diagram, capacitance elements C1 to C13 shown on the left side thereof are the above described respective capacitance elements. In this circuit, capacitance values C1 to C13 of respective capacitance elements are converted to voltage values V1 to V13 by means of CV converting circuits 30 to carry out an additive and subtractive operation using operation elements 31 to 36 with respect to these voltage values V1 to V13. Thus force components Fx, Fy, Fz in respective axial directions and moment components Mx, My, Mz about respective axes are outputted to terminals T1 to T6 as voltage values. Namely, the moment Mx is determined by carrying out an operation expressed as $Mx=V2-V4$ by using the operation element 31. In view of the fact that when attention is drawn to the row of Mx of the table of FIG. 9, the capacitance value C2 increases and the capacitance value C4 decreases, an operation to take a difference between both capacitance values as described above is carried out. By taking a difference therebetween, the sum total of a quantity of a change of the capacitance value C2 and a quantity of a change of the capacitance value C4 is obtained. In a manner similar to the above, the moment My is determined by performing an operation expressed as $My=V3-V1$ by using the operation element 32. Further, the force Fz is determined by performing an operation expressed as $Fz=V5$ by using the operation element 33 (functioning as a mere buffer). Further, the force Fx is determined by performing an operation expressed as $Fx=(V6+V7)-(V10+V11)$ by using the operation element 34. The force Fy is determined by performing an operation expressed as $Fy=(V8+V9)-(V12+V13)$ by using the operation element 35. In addition, the moment Mz is determined by performing an operation expressed as $Mz=(V6+V8+V10+V12)-(V7+V9+V11+V13)$
by using the operation element 36. It is to be noted that since the above described operation should be considered as an only one example, force components in respective axial directions or moment components about respective axes may be determined by other operations. For example, the force Fx may be determined by an operation expressed as $Fx=V6-V10$, the force Fy may be determined by an operation expressed as $Fy=V8-V12$, the force Fz may be determined by an operation expressed as $Fz=V1+V2+V3+V4+V5$, and the moment Mz may be determined by an operation expressed as $Mz=V6-V7$. In this case, it is sufficient to construct an operation circuit based on respective operations. In addition, in order to mutually standardize respective output values, it is sufficient to cause respective operation elements to have amplifying functions to adjust amplification factors.

In short, in the above mentioned first embodiment, detections of the moment Mx about the X-axis, the moment My about the Y-axis, and the force Fz in the Z-axis direction are carried out on the basis of displacements of the displacement electrodes D1 to D5 formed on the first displacement surface (the upper surface 11a of the flat plate 11); and detections of the force Fx in the X-axis direction, the force Fy in the Y-axis direction, and the moment Mz about the Z-axis are carried out on the basis of displacements of the displacement electrodes D6 to D13 formed on the second displacement surface (four side surfaces of the pillar body 12).

§3 Second Embodiment

Figure 11:
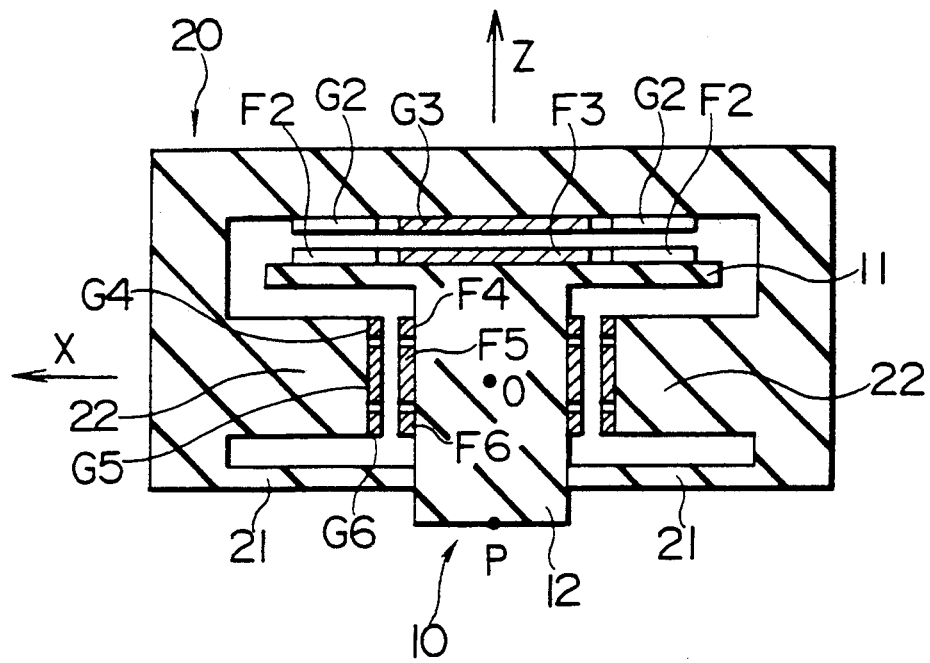
FIG. 11 is a side cross sectional view of a force detector according to a second embodiment presented in a more practical sense of this invention.
Figure 12:
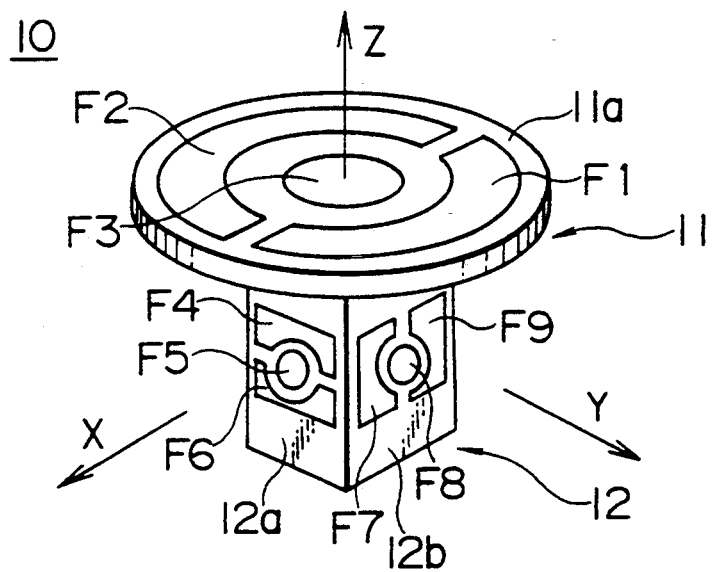
FIG. 12 is a perspective view of a displacement body 10 in the force detector shown in FIG. 11.
Figure 13:
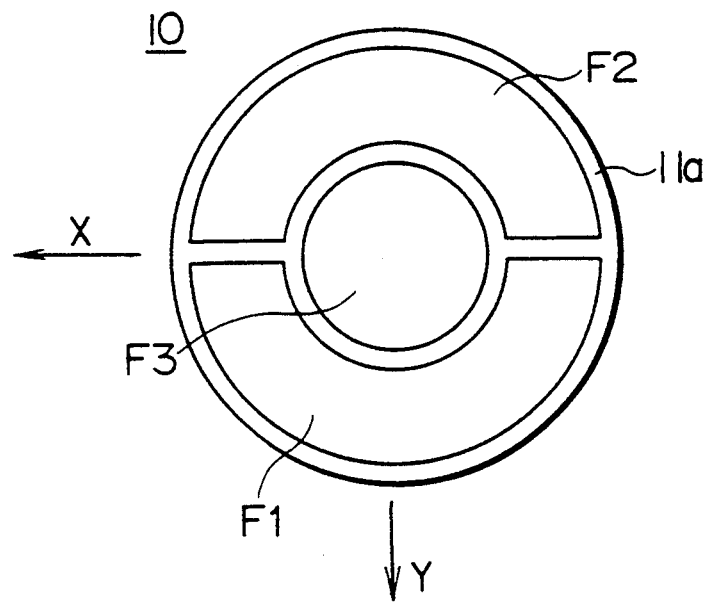
FIG. 13 is a top view of the displacement body 10 in the force detector shown in FIG. 11.
Figure 14:
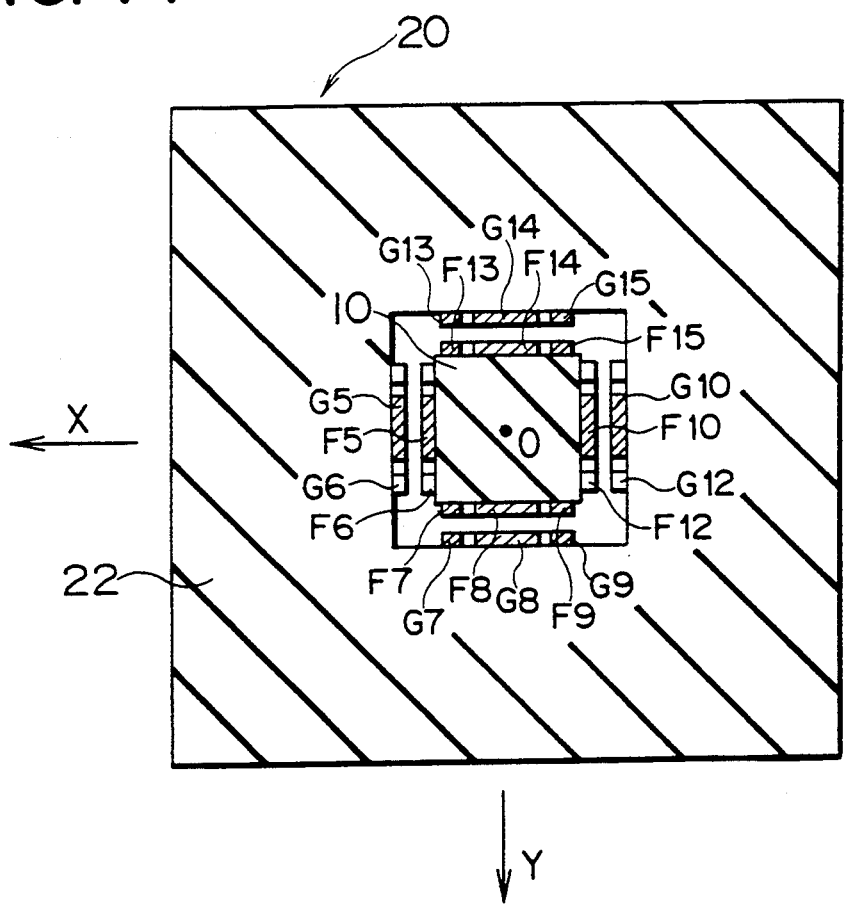
FIG. 14 is a lateral cross sectional view cut along the XY-plane of the force detector shown in FIG. 11.
Figure 15:
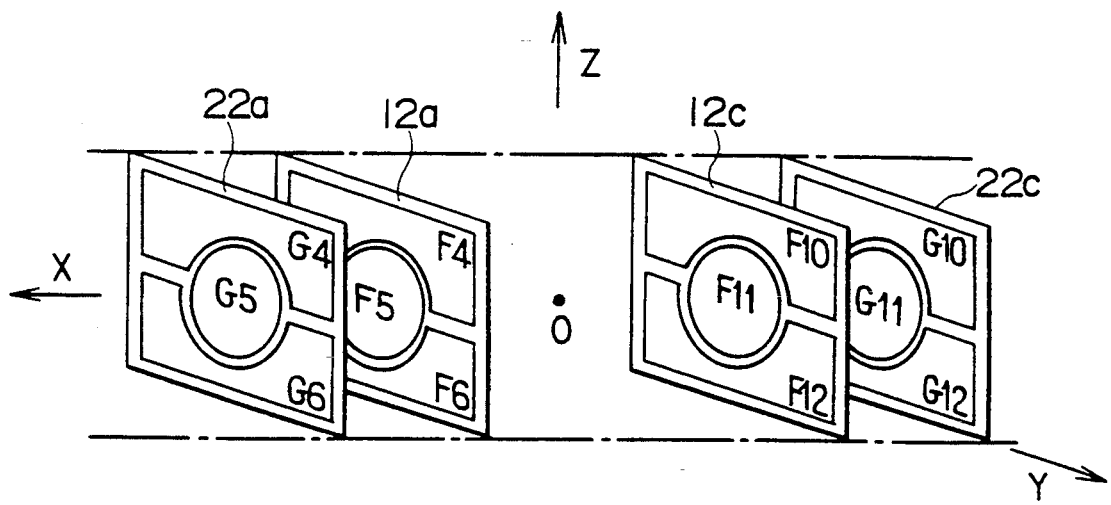
FIG. 15 is a view showing electrodes arranged on a plane perpendicular to the X-axis in the force detector shown in FIG. 11.
Figure 16:
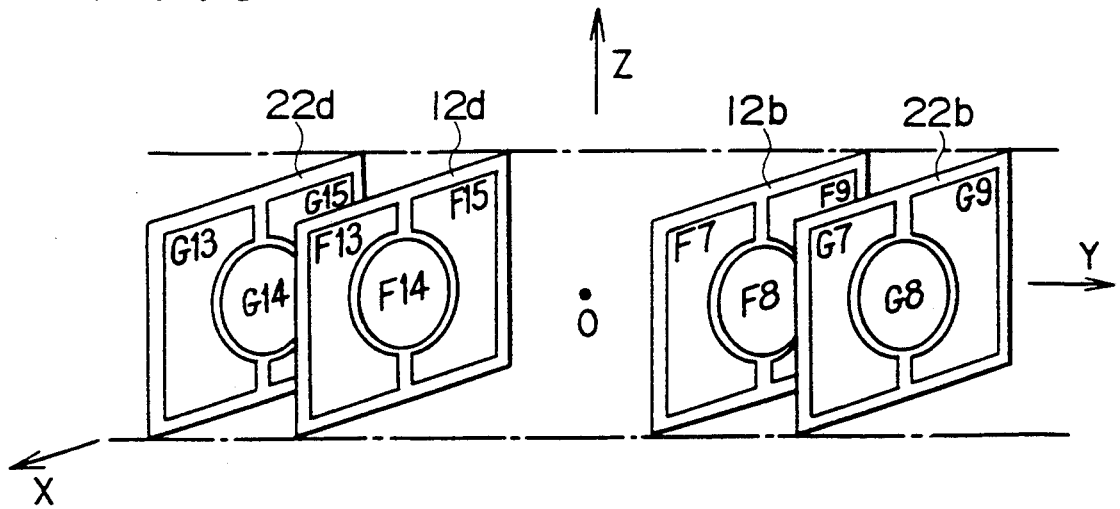
FIG. 16 is a view showing electrodes arranged on a plane perpendicular to the Y-axis in the force detector shown in FIG. 11.

A second embodiment presented in a practical sense of this invention will now be described. FIG. 11 is a side cross sectional view of a force detector according to this embodiment in a practical sense. This device also includes, similarly to the previously described basic embodiment, displacement body 10 and fixed body 20. These structures were as previously described. FIG. 12 is a perspective view of the displacement body 10 in this embodiment, and the cross section cut along the XZ-plane of the displacement body 10 is shown in FIG. 11. In this embodiment, fifteen displacement electrodes F1 to F15 in total (electrodes F10 to F15 thereof are not indicated in FIG. 12) are arranged. Namely, three displacement electrodes F1 to F3 are arranged on the first displacement surface (the upper surface 11a of the flat plate 11), and the state is clearly indicated in FIG. 13 showing the upper surface of the displacement body 10. Further, twelve displacement electrodes F4 to F15 are arranged on the second displacement surface (four side surfaces of the pillar body 12). While the state of the arrangement is also indicated in FIG. 14 showing the cross section cut along the XY-plane of this detector, it is more clearly indicated when looking at the electrode arrangement diagrams of FIGS. 15 and 16. FIG. 15 shows the positions of respective electrodes arranged on four surfaces vertical to the X-axis, i.e., a fixed surface 22a, a displacement surface 12a, a displacement surface 12c and a fixed surface 22c (make reference to FIG. 3 in connection with positions where these respective surfaces are formed). FIG. 16 shows positions of respective electrodes arranged on four surfaces vertical to the Y-axis, i.e., a fixed surface 22b, a displacement surface 12b, a displacement surface 12d and a fixed surface 22d (make reference to FIG. 3 in connection with these respective positions where these respective surfaces are formed). In short, displacement electrodes F4 to F15 are arranged by respective three displacement electrodes on four side surfaces of the pillar body 12, and fixed electrodes G4 to G15 are arranged at positions opposite to the displacement electrodes F4 to F15 on the internal surface of the fixed body 20. It is to be noted that three electrodes on the same plane are arranged in upper and lower directions in the arrangement shown in FIG. 15, whereas three electrodes on the same plane are arranged in left and right directions in the arrangement shown in FIG. 16.

Eventually, the fixed electrodes G1 to G15 are arranged so as to oppose the respective displacement electrodes F1 to F15. A capacitance element C1 is formed by paired electrodes F1, G1. In a manner similar to the above, capacitance elements C2, C3, ... C15 are formed by paired electrodes F2, G2, paired electrodes F3, G3, ... paired electrodes F15, G15, respectively. Let now consider how the capacitance values of respective capacitance elements C1 to C15 vary in the case where force components in respective axial directions and moment components about respective axes are applied to the working point P defined on the bottom surface of the displacement body 10. Thus, a table as shown in FIG. 17 is obtained. It is to be noted that since the reason why such a result is obtained is the same as the reason why a table as shown in FIG. 9 is obtained in the previously described first embodiment in a practical sense, detailed analysis is omitted in connection with respective cases here. When looking at the table of FIG. 17, it is similarly seen that unique results are obtained with respect to the force components Fx, Fy, Fz in respective axial directions and moment components Mx, My, Mz about respective axes, respectively. In view of this, if detection of capacitance values with respect to capacitance elements C1 to C15 is made, it is possible to arithmetically determine force components in respective axial directions and moment components Mx, My, Mz about respective axes on the basis of these capacitance values. Description of a circuit for performing such operation is omitted.

In short, in the above mentioned second embodiment, detections of the moment Mx about the X-axis and the force component Fz in the Z-axis direction are carried out on the basis of displacements of the displacement electrodes F1 to F3 formed on the first displacement surface (the upper surface 11a of the flat plate 11). Moreover, on the basis of displacements of the displacement electrodes F4 to F15 formed on the second displacement surface (four side surfaces of the pillar body 12), detections of the moment component Fx in the X-axis direction, the force component Fy in the Y-axis direction, the moment component My about Y-axis, and the moment component Mz about the Z-axis are carried out.

§4 Third Embodiment

Figure 18:
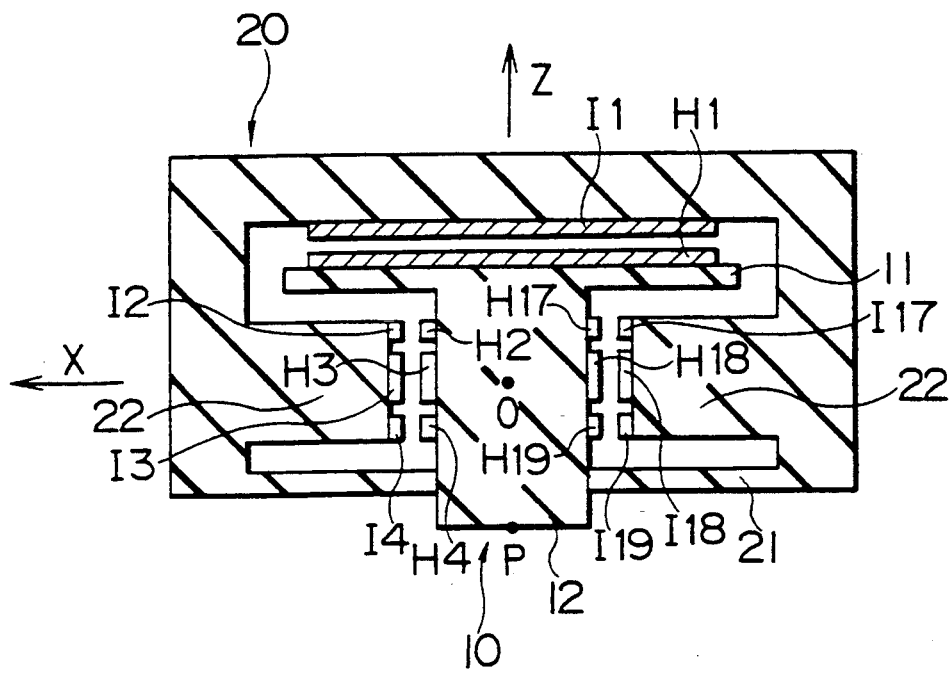
FIG. 18 is a side cross sectional view of a force detector according to a third embodiment presented in a more practical sense of this invention.
Figure 19:
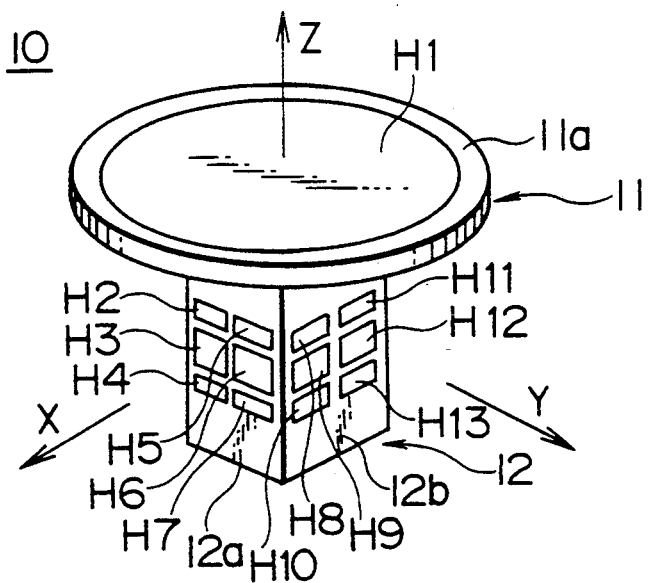
FIG. 19 is a perspective view of a displacement body 10 in the force detector shown in FIG. 18.
Figure 20:
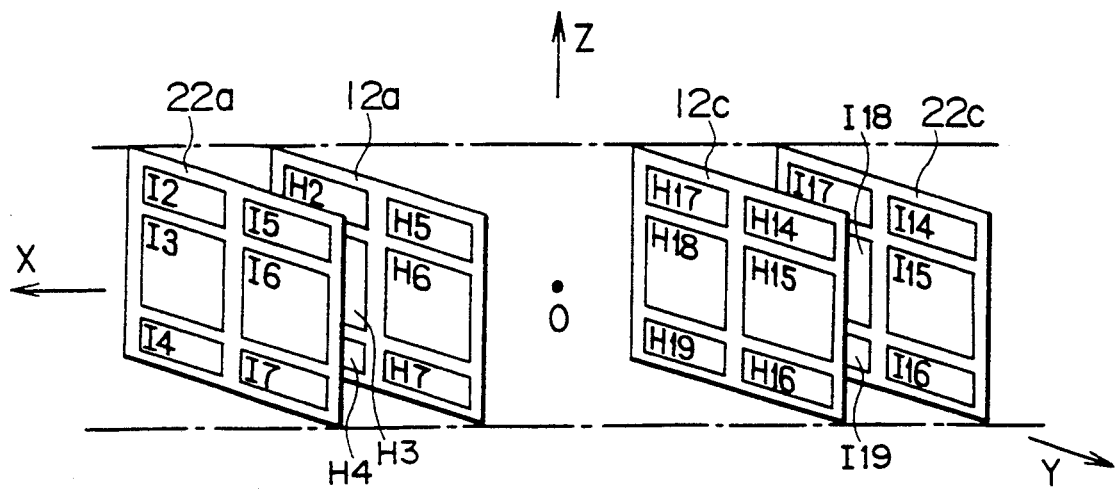
FIG. 20 is a view showing electrodes arranged on a plane perpendicular to the X-axis in the force detector shown in FIG. 18.
Figure 21:
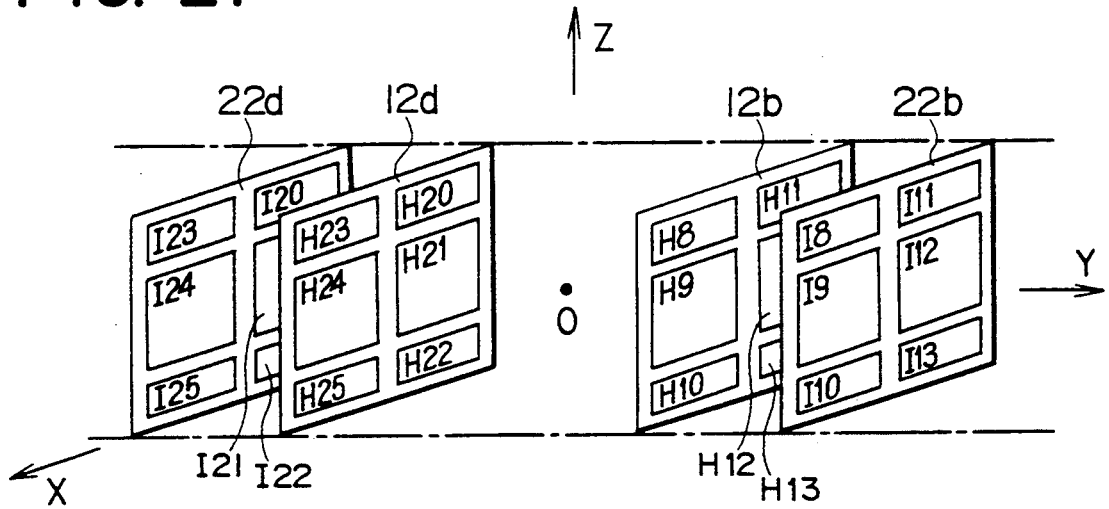
FIG. 21 is a view showing electrodes arranged on a plane perpendicular to the Y-axis in the force detector shown in FIG. 18.

A third embodiment in a practical sense of this invention will now be described. FIG. 18 is a side cross sectional view of a force detector according to this embodiment. This device also includes, similarly to the previously described basic embodiment, displacement body 10 and fixed body 20, and these structures are as previously described. FIG. 19 is a perspective view of the displacement body 10 in this embodiment, and the cross section cut along the XZ-plane of this displacement body 10 is shown in FIG. 18. In this embodiment, twenty five displacement electrodes H1 to H25 in total (the electrodes H14 to H25 thereof are not indicated in FIG. 19) are arranged. Namely, a single displacement electrode H1 is arranged on the first displacement surface (the upper surface 11a of the flat plate 11), and twenty four displacement electrodes H2 to H25 are arranged on the second displacement surface (four side surfaces of the pillar body 12). The state of this arrangement becomes more clear when looking at the electrode arrangement diagrams of FIGS. 20 and 21. FIG. 20 shows positions of respective electrodes arranged on four surfaces vertical to the X-axis, i.e., a fixed surface 22a, a displacement surface 12a, a displacement surface 12c, and a fixed surface 22c (with respect to the positions where respective surfaces are formed, make reference to FIG. 3), and FIG. 21 shows positions of respective electrodes arranged on four surfaces vertical to the Y-axis, i.e., a fixed surface 22b, a displacement surface 12b, a displacement surface 12d and a fixed surface 22d (with respect to the positions where respective surfaces are formed, make reference to FIG. 3). In short, displacement electrodes H2 to H25 are arranged by respective six displacement electrodes on the four surfaces of the pillar body 12, and fixed electrodes I1 to I25 are arranged at the positions opposite to the displacement electrodes H1 to H25 on the internal surface of the fixed body 20.

Now, a capacitance element C1 is formed by the paired electrodes H1, I1. In a manner similar to the above, capacitance elements C2, C3, ... C25 are formed by paired electrodes H2, I2, paired electrodes H3, I3, ... paired electrodes H25, I25, respectively. When consideration is made as to how capacitance values of respective capacitance elements C1 to C25 vary in the case where force components in respective directions and moment components about respective axes are applied to the working point P defined on the bottom surface of the displacement body 10, a table as shown in FIG. 22 is obtained. It is to be noted that since the reason why such a result is obtained is the same as the reason why a table as shown in FIG. 9 is obtained in the above described first embodiment, detailed analysis with respect to respective cases is omitted here. Similarly, when looking at the table of FIG. 22, it is seen that unique results are respectively obtained with respect to force components Fx, Fy, Fz in respective axial directions and moment components Mx, My, Mz about respective axes. In view of this, if capacitance values with respect to respective capacitance elements C1 to C25 are detected, it is possible to arithmetically determine force components Fx, Fy, Fz in respective axial directions and moment components Mx, My, Mz about respective axes on the basis of these capacitance values. Explanation of a circuit for performing such operation is omitted.

In short, in the above mentioned third embodiment, on the basis of a displacement of the displacement electrode HI formed on the first displacement surface (the upper surface 11a of the flat plate 11), detection of the force component Fz in the Z-axis direction is made; and on the basis of displacements of displacement electrodes H2 to H25 formed on the second displacement surface (four side surfaces of the pillar body 12), detections of the force component Fx in the X-axis direction, the moment component Mx about the X-axis, the force component Fy in the Y-axis direction, the moment component My about the Y-axis, and the moment component Mz about the Z-axis are carried out.

§5 Other Embodiments

While this invention has been described in accordance with several embodiments, this invention is not limited to only these embodiments, but may be embodied in various modes. Other embodiments will be disclosed below.

(1) The form and the arrangement of respective electrodes are not limited to the above described embodiments. In addition, electrodes in various forms may be arranged at various positions. FIGS. 23A and 23B show several embodiments of displacement electrodes formed on the first displacement surface (the upper surface 11a of the flat plate 11). Further, FIGS. 24A to 24F show several embodiments (including displacement electrodes used in the above described embodiments) formed on the second displacement surface (four side surfaces of the pillar body 12).

Figure 25:
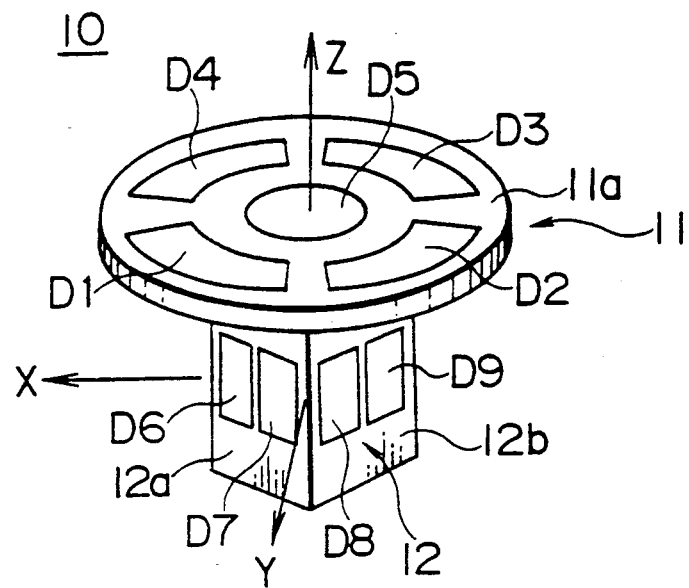
FIG. 25 is a view showing an embodiment in which another definition is made with respect to the XYZ three-dimensional coordinate system in the force detector shown in FIG. 5.

(2) The positional relationship of respective electrodes with respect to the XYZ three-dimensional coordinate system is arbitrary. For example, in the embodiment shown in FIG. 6, the X-axis is defined in a direction from the center of the displacement electrode D3 toward the center of the displacement electrode D1, and the Y-axis is defined in a direction from the center of the displacement electrode D4 toward the center of the displacement electrode D2. Such definition of coordinates may be changed as shown in FIG. 25. In the embodiment of FIG. 25, the X-axis is defined at the boundary position between the displacement electrodes D1 and D4, and the Y-axis is defined at the boundary position between the displacement electrodes D1 and D2. This definition just has the relationship obtained by rotating the positional relationship shown in FIG. 6 by 45 degrees on the XY-plane. It is a matter of course that since in the case where such definition is made, a result different from a result in the table as shown in FIG. 9 is obtained, it is necessary to construct a circuit different from the circuit shown in FIG. 10.

Figure 26:
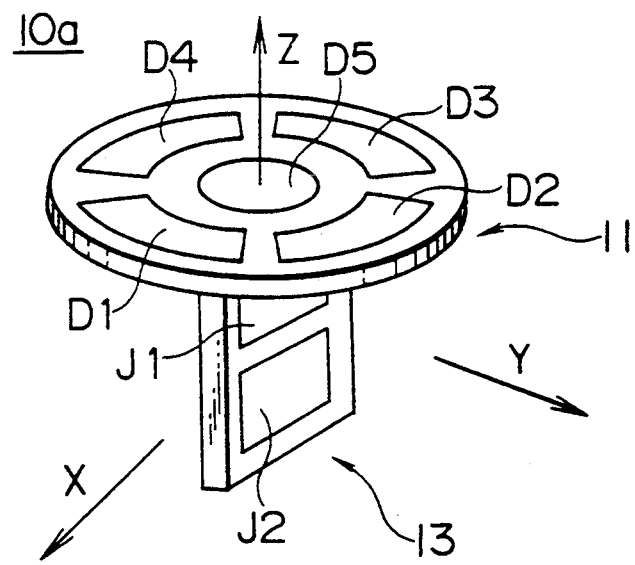
FIG. 26 is a perspective view of a displacement body used for a force detector according to a further embodiment of this invention.

(3) The form of the displacement body 10 may be arbitrarily changed. For example, a displacement body 10a shown in FIG. 26 is of a structure such that a square flat plate 13 is connected on the lower surface of a disk shaped flat plate 11. Displacement electrodes J1, J2 are formed on one surface of the flat plate 13, and displacement electrodes J3, J4 (not shown) are formed on the other surface. With such electrode configuration, it is impossible to detect all the components Fx, Fy, Fz, Mx, My, Mz. However, this invention is not necessarily limited to a force detector adapted to detect all the six components. In a specific industrial machine, there are instances where it is required to detect only specific several ones of these six components. In such case, it is sufficient to arrange only electrodes necessary for detecting required components. Accordingly, it is enough to design the displacement body 10 so that it takes a form most suitable for disposing necessary electrodes at necessary positions. Accordingly, it is not necessary that the flat plate 11 is disk shaped, but the flat plate 11 may be rectangular or triangular. Further, it is not necessary that the pillar body 12 is in the form of square post, but may be columnar or triangular.

(4) While materials of respective components are not specifically referred to in the above described embodiments, any material which can satisfy specific properties required for respective components may be used. For example, as far as respective electrodes are conductive, they may be constituted by any material including metal. Further, the displacement body 10 and/or the fixed body 20 may be comprised of a conductive material or an insulating material. It should be noted that in the case where a displacement body 10 or a fixed body 20 comprised of a conductive material is used, respective electrodes may be formed through an insulating film thereon. Furthermore, while, in the above described embodiments, the flexible portion 21 is formed by the portion in the form of flat plate of thin thickness, any other material having high flexibility may be used only for this portion. In addition, an undulating structure such as a diaphragm, etc. may be used, or a bridge shaped structure may be used.

Figure 27:
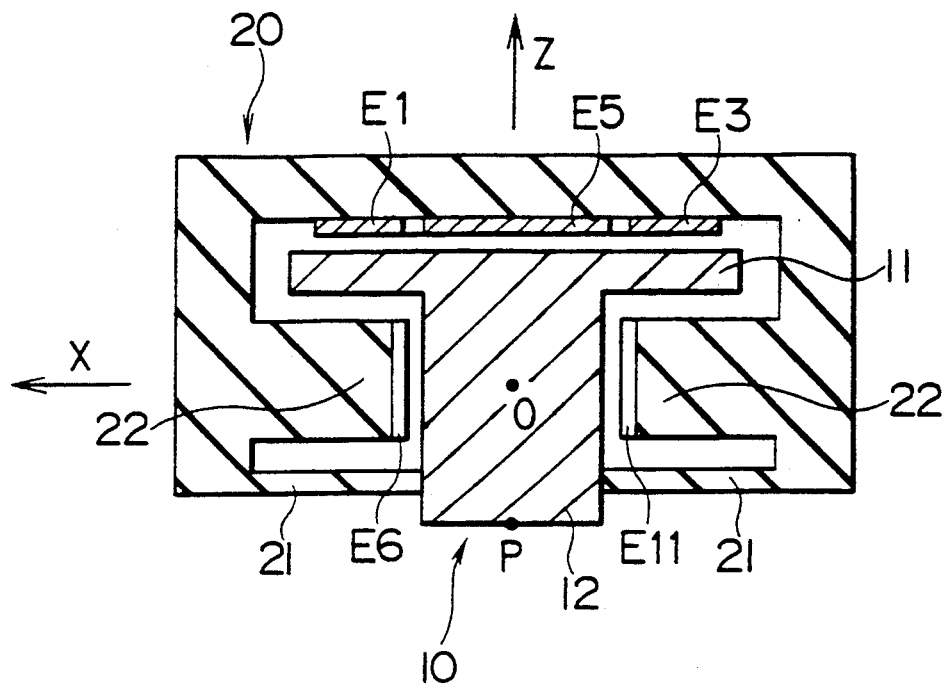
FIG. 27 is a side cross sectional view showing an embodiment in which a common electrode is used for displacement electrodes on the displacement body.
Figure 28:
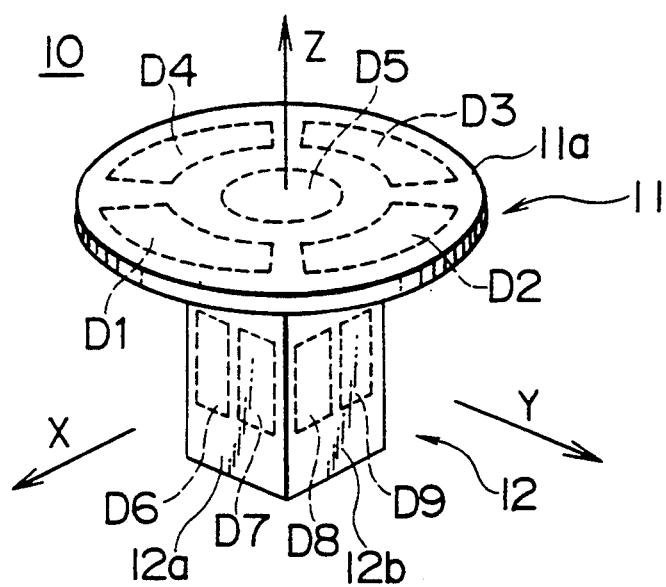
FIG. 28 is a view showing an electrode area on the displacement body 10 in the embodiment shown in FIG. 27.

(5) While a pair of opposite electrodes are necessarily used in order to form a set of capacitance elements in the above described embodiments, a common electrode may be used with respect to a large number of capacitance elements. For example, in the embodiment shown in FIG. 5, thirteen displacement electrodes D1 to D13 are formed on the displacement body 10, and thirteen fixed electrodes E1 to E13 are similarly formed on the fixed body 20, thus to constitute thirteen capacitance elements. However, if the displacement body 10 itself is constituted by a conductive material such as metal, etc., it becomes unnecessary to positively form thirteen displacement electrodes on the displacement body 10 as shown in FIG. 27. Namely, as indicated by broken lines in FIG. 28, respective portions of the conductive displacement body 10 will perform functions equivalent to those of displacement electrodes D1 to D13. For example, in the circuit shown in FIG. 10, this displacement body 10 may be used as one electrode (electrode on the earth potential side in the circuit diagram) which is common to thirteen capacitance elements C1 to C13. Conversely, if the fixed body 20 itself is constituted by a conductive material such as metal, etc., respective portions of the fixed body 20 will perform functions equivalent to those of the fixed electrodes E1 to E13.

(6) While, in the above described embodiments, the first displacement surface (the upper surface 11a of the flat plate 11) and the second displacement surface (four side surfaces of the pillar body 12) are perpendicular to each other, if the both displacement surfaces have the relationship that they cross each other, it is not necessarily required that they are perpendicular to each other, and it is not necessarily required that the both displacement surfaces are planar. However, in order to simplify operations of respective axial components of a force in the XYZ three-dimensional coordinate system, it is preferable to use two planes perpendicular to each other as both displacement surfaces, respectively.

(7) While, in the above described embodiments, the distance between the displacement surface and the fixed surface opposite thereto is detected as a change in the electrostatic capacitance of a capacitance element constituted by a displacement electrode formed on the displacement surface and a fixed electrode formed on the fixed surface, the method of detecting distance is not limited to the method using such capacitance element. For example, if a piezo resistance element or a piezoelectric element is inserted between the displacement electrode and the fixed electrode, it is possible to detect the distance between both electrodes as a voltage value produced by the piezo resistance element or the piezoelectric element.

(8) While the above described embodiments are directed to the embodiment where this invention is applied to a force detector, this invention may be applied to an acceleration detector or a detector for magnetism. Namely, if the displacement body 10 is constituted by a material having a weight to some extent, when an acceleration is exerted on this detector, a force corresponding to the exerted acceleration is applied to the displacement body 10. Thus, this detector can be utilized as an acceleration detector. In addition, if the displacement body 10 is constituted by a magnetic body, when this detector is placed within a magnetic field, a magnetic force is applied to the displacement body 10. Thus, this detector can be utilized as a detector for magnetism.

§6 Merits of the Detector Using Capacitance Elements

Finally, the merits of the detector using capacitance elements described in the previously described respective embodiments will be described. The first merit is that the temperature characteristic is excellent. Generally, a detector using semiconductor has the drawback that it is apt to undergo the influence of a temperature change. However, the detector using capacitance element hardly undergoes the influence of a temperature change. For this reason, such detector can be applied to a rigorous temperature condition required for a vehicle mounted detector. Secondly, since the capacitance value of the capacitance element is easy to be converted to a signal such as a voltage or frequency signal, the signal processing is advantageously simplified. Thirdly, since a pair of opposite electrodes are maintained in a non contact state in the case of the capacitance element, there is advantageously no error factor such as residual stress, etc. In the case of the detector using a strain gauge or a piezo resistance element, when any residual stress occurs in the structure serving as an object in which displacement is caused to be produced, precise detection cannot be carried out. Fourthly, because the structure is simple, the detector using capacitance element can be advantageously produced at a low cost.

As described above, in accordance with the detector according to this invention, since an approach is employed to define two displacement surfaces of the first displacement surface and the second displacement surface on the displacement body, and to define, as surfaces opposite thereto, two fixed surfaces of the first fixed surface and the second fixed surface on the fixed body, thus to determine, on the basis of detected distances between respective surfaces, a force exerted on the displacement body, it becomes possible to detect force components in respective axial directions and moment components about respective axes in the XYZ three-dimensional coordinate system.

What is claimed is:

1. A force detector for detecting components in multi-dimensional directions of a force in an XYZ three-dimensional coordinate system, said detector comprising:
   a fixed body (20) having a flexible portion (21) deformed when a force is applied thereto;
   a displacement body (10) supported by said flexible portion;
   first detection means (D1 to D5, E1 to E5) for detecting a distance between a first displacement surface (11a) defined at a portion of said displacement body and a first fixed surface (20a) opposite to said first displacement surface and defined at a portion of said fixed body;
   second detection means (D6 to D13, E6 to E13) for detecting a distance between a second displacement surface (12a, 12b, 12c, 12d) intersecting with said first displacement surface and defined at a portion of said displacement body and a second fixed surface (22a, 22b, 22c, 22d) opposite to said second displacement surface and defined at a portion of said fixed body; and one of operational or arithmetic means (30 to 36) for arithmetically determining a force exerted on said displacement body every force components in the coordinate axis directions and moment components about the coordinate axes on the basis of a detection value obtained by said first detection means and a detection value obtained by said second detection means, wherein said first and second displacement surfaces are formed so that they are perpendicular to each other, and said first and second fixed surfaces are formed so that they are perpendicular to each other.

2. A force detector with respect to components in multi-dimensional direction as set forth in claim 1, wherein an origin (0) of the XYZ three-dimensional coordinate system is defined at a predetermined position within said displacement body, a first displacement surface (11a) is defined on a plane in parallel to an XY-plane, and a second displacement surface (12a, 12b, 12c, 12d) is defined on a plane in parallel to the Z-axis, to determine a moment component Mx about the X-axis, a moment component My about the Y-axis, and a force component Fz in a Z-axis direction on the basis of a detection value obtained by said first detection means (D1 to D5, E1 to E5), and to determine a force component Fx in the X-axis direction, a force component Fy in the Y-axis direction, and a moment component Mz about the Z-axis on the basis of a detection value obtained by said second detection means (D6 to D13, E6 to E13).

3. A force detector with respect to components in multi-dimensional directions as set force in claim 1, wherein an origin (0) of the XYZ three-dimensional coordinate system is defined at a predetermined position within said displacement body, a first displacement surface (11a) is defined on a plane in parallel to an XY-plane, and a second displacement surface (12a, 12b, 12c, 12d) is defined on a plane in parallel to the Z-axis, to determine a moment component Mx about the X-axis and a force component Fz in the Z-axis direction on the basis of a detection value obtained by said first detection means (F1 to F3, G1 to G3), and to determine a force component Fx in the X-axis direction, a force component Fy in the Y-axis direction, a moment component My about the Y-axis, and a moment component Mz about the Z-axis on the basis of a detection value obtained by said second detection means (F4 to F15, G4 to G15).

4. A force detector with respect to components in multi-dimensional directions as set forth in claim 1, wherein an origin (0) of the XYZ three-dimensional coordinate system is defined at a predetermined position within said displacement body, a first displacement surface (11a) is defined on a plane in parallel to an XY-plane, and a second displacement surface (12a, 12b, 12c, 12d) is defined on a plane in parallel to the Z-axis, to determine a force component Fz in the Z-axis direction on the basis of a detection value obtained by said first detection means (H1, I1), and to determine a force component Fx in the X-axis direction, a moment component Mx about the X-axis, a force component Fy in the Y-axis direction, a moment component My about the Y-axis, and a moment component Mz about the Z-axis on the basis of a detection value obtained by said second detection means (H2 to H25, I2 to I25).

5. A force detector for detecting components in multidimensional directions of a force in an XYZ three-dimensional coordinate system, said detector comprising:

a fixed body (20) having a flexible portion (21) deformed when a force is applied thereto;

a displacement body (10) supported by said flexible portion;

first detection means (D1 to D5, E1 to E5) for detecting a distance between a first displacement surface (11a) defined at a portion of said displacement body and a first fixed surface (20a) opposite to said first displacement surface and defined at a portion of said fixed body;

second detection means (D6 to D13, E6 to E13) for detecting a distance between a second displacement surface (12a, 12b, 12c, 12d) intersecting with said first displacement surface and defined at a portion of said displacement body and a second fixed surface (22a, 22b, 22c, 22d) opposite to said second displacement surface and defined at a portion of said fixed body; and one of operational or arithmetic means (30 to 36) for arithmetically determining a force exerted on said displacement body every force components in the coordinate axis directions and moment components about the coordinate axes on the basis of a detection value obtained by said first detection means and a detection value obtained by said second detection means, wherein said first detection means include a first capacitance element constituted by a first displacement electrode formed on said first displacement surface and a first fixed electrode formed on said first fixed surface to carry out detection of a distance on the basis of a capacitance value of said first capacitance element, and wherein said second detection means includes a second capacitance element constituted by a second displacement electrode formed on said second displacement surface and a second fixed electrode formed on said second fixed surface to carry out detection of a distance on the basis of a capacitance value of said second capacitance element.

6. A detector for detecting components in multi-dimensional directions of a force in an XYZ three-dimensional coordinate system, said detector comprising:

a fixed body (20) having a flexible portion (21) deformed when a force is applied thereto;

a displacement body (10) supported by said flexible portion;

first detection means (D1 to D5, E1 to E5) for detecting a distance between a first displacement surface (11a) defined at a portion of said displacement body and a first fixed surface (20a) opposite to said first displacement surface and defined at a portion of said fixed body;

second detection means (D6 to D13, E6 to E13) for detecting a distance between a second displacement surface (12a, 12b, 12c, 12d) intersecting with said first displacement surface and defined at a portion of said displacement body and a second fixed surface (22a, 22b, 22c, 22d) opposite to said second displacement surface and defined at a portion of said fixed body; and one of operational or arithmetic means (30 to 36) for arithmetically determining a force exerted on said displacement body every force components in the coordinate axis directions and moment components about the coordinate axes on the basis of a detection value obtained by said first detection means and a detection value obtained by said second detection means, wherein there is further provided an acceleration detector such that a force produced due to acceleration is caused to be exerted on said displacement body, thus permitting detection of an acceleration.

7. A detector for detecting components in multi-dimensional directions of a force in an XYZ three-dimensional coordinate system, said detector comprising:

a fixed body (20) having a flexible portion (21) deformed when a force is applied thereto;

a displacement body (10) supported by said flexible portion;

first detection means (D1 to D5, E1 to E5) for detecting a distance between a first displacement surface (11a) defined at a portion of said displacement body and a first fixed surface (20a) opposite to said first displacement surface and defined at a portion of said fixed body;

second detection means (D6 to D13, E6 to E13) for detecting a distance between a second displacement surface (12a, 12b, 12c, 12d) intersecting with said first displacement surface and defined at a portion of said-displacement body and a second fixed surface (22a, 22b, 22c, 22d) opposite to said second displacement surface and defined at a portion of said fixed body; and one of operational or arithmetic means (30 to 36) for arithmetically determining a force exerted on said displacement body every force components in the coordinate axis directions and moment components about the coordinate axes on the basis of a detection value obtained by said first detection means and a detection value obtained by said second detection means, wherein there is further provided a detector for magnetism such that a force produced due to magnetism is caused to be exerted on said displacement body, thus permitting detection of magnetism.

* * * * *